United States Patent [19]

Lingstaedt et al.

[11] Patent Number: 5,029,063
[45] Date of Patent: Jul. 2, 1991

[54] MOSFET MULTIPLYING CIRCUIT

[75] Inventors: Ernst Lingstaedt, Zorneding; Paul Miller, Munich, both of Fed. Rep. of Germany

[73] Assignee: Eurosil Electronic GmbH, Eching, Fed. Rep. of Germany

[21] Appl. No.: 476,336

[22] Filed: Feb. 7, 1990

[30] Foreign Application Priority Data

Mar. 25, 1989 [DE] Fed. Rep. of Germany ....... 3909945
Sep. 22, 1989 [DE] Fed. Rep. of Germany ....... 3931596

[51] Int. Cl.$^5$ ............................................. H02M 3/07
[52] U.S. Cl. .................................... 363/60; 307/296.2
[58] Field of Search ............................ 307/296.2, 296.8; 363/59, 60; 320/1

[56] References Cited

U.S. PATENT DOCUMENTS

| | | | |
|---|---|---|---|
| 4,271,461 | 6/1981 | Hoffmann et al. | 307/296.8 |
| 4,621,315 | 11/1986 | Vaughn et al. | 363/60 |
| 4,628,214 | 12/1986 | Leuschner | 307/296.2 |
| 4,843,258 | 6/1989 | Miyawaki et al. | 307/296.2 |

FOREIGN PATENT DOCUMENTS

| | | |
|---|---|---|
| 0010137 | 4/1980 | European Pat. Off. . |
| 8606539 | 6/1986 | European Pat. Off. . |
| 2812908 | 9/1978 | Fed. Rep. of Germany . |

OTHER PUBLICATIONS

Electronics Design, Aug. 18, 1983, pp. 189-196, "EEPROM Adapts Easily . . .".

*Primary Examiner*—William H. Beha, Jr.
*Attorney, Agent, or Firm*—Spencer & Frank

[57] ABSTRACT

The invention relates to a voltage multiplying circuit having several stages, with each stage having a pumping capacitor and several MOS switching transistors. The switching transistors are so controlled by clock signals that the charge of a pumping capacitor of one stage is transferred to the pumping capacitor of the following stage. Operation of a circuit of this type with operating voltages substantially lower than 5 V entails considerable drawbacks. In accordance with the invention, therefore, each stage of a voltage multiplying circuit of this type is fitted with an additional transistor and an additional correction capacitor. As a result, the circuit in accordance with the invention is suppliable with an operating voltage of 2 V, for example. In another circuit arrangement, the transistors of the last two or three stages of the voltage multiplying circuit are of one conductivity type, while the transistors of the previous stages are of the opposite conductivity type. The last stages do not need a correction capacitor.

12 Claims, 4 Drawing Sheets

MOSFET MULTIPLYING CIRCUIT

BACKGROUND OF THE INVENTION

The invention relates to a voltage multiplying circuit having several stages wherein each stage includes first and second MOS transistors and first and second capacitors, with a first summing point connected directly to the source electrode of the first MOS transistor and being connected via the first capacitor to a first clock line supplying a first clock signal, with a second summing point which connects the gate electrode of the first MOS transistor directly to the drain electrode of the second MOS transistor being connected via the second capacitor to a second clock line supplying a second clock signal, and with adjacent stages being connected via the first summing point of the one stage to the drain electrode of the first MOS transistor of the other stage.

A circuit of this type is known from the article "EE-PROM adapts easily to in-system changes", Electronic Design, Aug. 18, 1983, pages 189 to 196, in particular FIG. 3a. A circuit of this type is used for generating a programming and erasing voltage from electrically erasable, non-volatile memory elements (EEPROMs) above a supply voltage of 5 V and in the region of 20 V. A circuit of this type is shown in FIG. 1, and is assembled from several voltage multiplying stages $H_N$, with three stages $H_{N-1}$, $H_N$ and $H_{N+1}$ being drawn. In addition, a voltage multiplying circuit of this type can contain further stages, the number of which depends on the level of the voltage to be generated.

In the following, this circuit will be described and its mode of operation in the steady state explained.

The entire circuit is designed with MOS technology, with the MOS field-effect transistors (MOS-FETs) being of the p-channel type. The voltage multiplying stages $H_{N-1}$, $H_N$ and $H_{N+1}$ each comprise two MOS transistors designated as $T_{1,N-1}$ and $T_{2,N-1}$, $T_{1,N}$ and $T_{2,N}$, and $T_{1,N+1}$ and $T_{2,N+1}$ respectively, and two MOS capacitors designated as $C_{N-1}$ and $C_{B,N-1}$, $C_N$ and $C_{B,N}$, and $C_{B,N+1}$ and $C_{B,N+1}$ respectively. The connection mode of these elements will now be explained with reference to stage $H_N$. The source electrode of the first transistor $T_{1,N}$ is connected via a first summing piont $X_{1,N}$ both to the first connecting electrode of the first capacitor $C_N$ and to the source electrode of the second transistor $T_{2,N}$, and additionally to the drain electrode of the first transistor $T_{1,N-1}$ of the previous stage $H_{N-1}$, while the drain electrode of the first transistor $T_{1,N}$ is connected to the first summing point $X_{1,N+1}$ of the following stage $H_{N+1}$. The second connecting electrode of the first capacitor $C_N$ is connected to a first clock line $L_{1,N}$ supplying a first clock signal $\emptyset$. Furthermore, a second summing point $X_{2,N}$ connecting the drain electrode of the second transistor $T_{2,N}$ to the gate electrode of the first transistor $T_{1,N}$ is connected via the second capacitor $C_{B,N}$ to a second clock line $L_{2,N}$ supplying a second clock signal $\emptyset_B$. Finally, the second summing point $X_{2,N}$ is connected to the gate electrode of the second transistor $T_{2,N+1}$ of the following stage $H_{N+1}$.

The input 1 is connected to the source electrode of an input transistor $T_0$, while the drain electrode of this transistor is connected to the first summing point $X_{1,N-1}$ of the first stage $H_{N-1}$. The gate electrode of this transistor $T_0$ is supplied with the clock signal $\emptyset$ via a lead. The voltage to be multiplied, preferably an operating voltage $V_{DD}$, is supplied to the input 1. The multiplied output voltage $V_{HV}$ can then be tapped at output 2.

Subsequent stages $H_N$ and $H_{N+1}$ are supplied with first clock signals $\emptyset$ and $\overline{\emptyset}$, which are in opposite phase to one another. The corresponding second clock signals $\emptyset_B$ and $\overline{\emptyset}_B$ are also in opposite phase to one another. The voltage rise of the first clock signal $\emptyset$ or $\overline{\emptyset}$ is usually as large as the available supply voltage, for example 5 V, while that of the second clock signal $\emptyset_B$ or $\overline{\emptyset}_B$ is a few volts higher, for example 8.5 V, with all voltages however being negative and the reference potential being zero volts since the transistors are of the p-channel type.

As mentioned above, this voltage multiplying circuit is designed as an integrated MOS circuit with p-channel field-effect transistors, so that the substrate has the same potential as the source electrodes of these field-effect transistors. As a result, parasitic capacitances are generated between the source/drain area of each transistor and the substrate, designated in the circuit diagram according to FIG. 1 as $C_p$.

Voltage multiplication is achieved by charges being transferred from one stage to the following stage using the first capacitors $C_1, C_2, \ldots C_N, \ldots, C_{N+m}$ (m>0), for which reason these capacitors can also be designated as pumping capacitors. Assuming the pumping capacitor $C_N$ of the stage $H_N$ receives a certain charge quantity from the pumping capacitor $C_{N-1}$ of the previous stage $H_{N-1}$ via the conducting first transistor $T_{1,N-1}$ of the latter, with the high level ($V_\emptyset = 0$ V) of the clock signal $\emptyset$ being applied to pumping capacitor $C_N$, and the low level ($\overline{V_\emptyset} = -5$ V) of the clock signal $\overline{\emptyset}$ to the previous stage $H_{N-1}$. The first transistor $T_{1,N}$ of the stage $H_N$ must be non-conducting, which is achieved by the second transistor of this stage $H_N$ being conducting, since its gate/source voltage is equal to that of the transistor $T_{1,N-1}$. The gate/source voltage at the transistor $T_{1,N}$ is therefore 0 V, meaning that this transistor is in the non-conducting state. The second capacitor $C_{B,N}$ of stage $H_N$ is at the high level ($V_{\emptyset B} = 0$ V) of the clock signal $\emptyset_B$ at this point, while the low level ($\overline{V_{\emptyset B}} = -8.5$ V) is passed to the second capacitor $C_{B,N-1}$ of the previous stage $H_{N-1}$.

The voltage level of $-8.5$ V is generated by a voltage doubler circuit. During the charge transfer process from capacitor $C_{N-1}$ to $C_N$, the first summing point $X_{1,N}$ of stage $H_N$, for example, is at a potential of approx. $-5$ V (and therefore also the first summing point $X_{1,N-1}$ of the previous stage $H_{N-1}$) and the first summing point $X_{1,N+1}$ of the subsequent stage at approx. $-15$ V.

If the clock now switches to the next phase, the second capacitor $C_{B,N}$ of the stage $H_N$ is at the low level ($\overline{V_{\emptyset B}} = -8.5$ V) of the clock signal $\overline{\emptyset}_B$, such that the first transistor $T_{1,N}$ changes over to the conducting state. The pumping capacitor $C_N$ also receives the low level of the clock signal $\overline{\emptyset}$, so that the first summing point $X_{1,N}$ of stage $H_N$ is shifted from approx. $-5$ V to approx. $-10$ V.

The second transistor $T_{2,N}$ of stage $H_N$ is by contrast non-conducting, since the potential at the second summing point $X_{2,N-1}$ of the previous stage $H_{N-1}$ rises on account of the high level applied to the second capacitor $C_{B,N-1}$, with the first transistor $T_{1,N-1}$ of the previous stage $H_{N-1}$ passing simultaneously to the non-conducting state. The charge of the pumping capacitor $C_N$ is therefore transferred to the pumping capacitor $C_{N+1}$ of the next stage $H_{N+1}$, i.e. the first summing point $X_{1,N+1}$ of this next stage is also at approx. $-10$ V. The next clock pulse $\emptyset$ now shifts the voltage level at this first summing point $X_{1,N+1}$ to approx. $-15$ V, while the voltage level at the first summing point $X_{1,N}$ of stage $H_N$ drops to approx. $-5$ V because of this clock change. The transistors of the two stages $H_{N+1}$ and $H_N$ operate in accordance with the above description.

In order to keep the voltage drop at the first transistor $T_{1,N}$ of stage $H_N$ as low as possible when transferring the charge from capacitor $C_N$ to capacitor $C_{N+1}$, the voltage difference $\Delta V$ between the first summing point $X_{1,N}$ and the second summing point $X_{2,N}$ must be greater than the sum of the threshold voltage and the threshold voltage shift. The threshold voltage shift occurs because of the substrate effect. Since the absolute values of the voltage level at the first and second summing points become ever larger from stage to stage, the voltage difference $\Delta V$ must be large enough to ensure a sufficiently low voltage drop across the first transistor even with a substrate bias voltage of, for example, $-20$ V in the last stage. With a supply voltage $V_{DD}$ of 5 V, it is possible, using an integrated voltage doubler circuit for generating the second clock voltage $V_{\emptyset B}$ or $V_{\overline{\emptyset} B}$, to achieve a sufficient value for the voltage difference $\Delta V$.

However, if the supply voltage $V_{DD}$ is substantially below 5 V, for example 2 V, a sufficient voltage difference $\Delta V$ cannot be generated at acceptable expense, since a large pumping capacitance would be necessary in the voltage doubler circuit. This would however be avoidable by using a voltage trebler circuit instead of a voltage doubler circuit to generate a higher clock voltage $V_{\emptyset B}$ or $V_{\overline{\emptyset} B}$. A solution of this type nevertheless has a number of drawbacks, since a voltage trebler circuit requires considerably more components and also more integrated and large pumping capacitors. Finally, the generation of the clock voltage $V_{\emptyset B}$ and $V_{\overline{\emptyset} B}$ from a higher voltage also leads to an increased power consumption due to unavoidable charge transfer losses from parasitic capacitances.

SUMMARY OF THE INVENTION

The object of the invention is to provide a voltage multiplying circuit of the type indicated at the outset, which operates with an operating voltage of substantially less than 5 V, has a minimum energy consumption, and does not require an increased amount of circuitry work.

This object is achieved in a voltage multiplying circuit of the type mentioned at the outset by connecting the gate electrode of the second MOS transistor of the one stage to the gate electrode of the first MOS transistor of the other stage, with each stage having means for blocking the first MOS transistor by setting its gate/source voltage in such a way that it is equal to or just below the sum of the threshold voltage and the threshold voltage shift.

In a voltage multiplying circuit in accordance with the invention, the gate/source voltage of the first transistor of each stage for blocking this transistor is not adjusted to the value zero, as in the circuit according to FIG. 1, but such that this value just reaches or falls slightly short of the sum of threshold voltage and the threshold voltage shift.

As a result, only a low signal rise is necessary for the clock signal $\emptyset_B$ and $\overline{\emptyset}_B$, so that a voltage doubler circuit, which does not require major circuitry or large integrated pumping capacitors, is sufficient to generate it.

A particular advantage of the invention is that process-related fluctuations of the threshold voltage and the threshold voltage shift due to the substrate effect are compensated.

In addition, the additional circuitry expense for an embodiment according to the invention is low in comparison with the known circuit according to FIG. 1, since each stage additionally contains only one transistor and one capacitor of low capacitance.

In an advantageous embodiment of the invention, the correction signal line is subjected to a constant operating voltage potential. As a result, the maximum achievable compensation of the threshold voltage and the threshold voltage shift corresponds to the value of the voltage rise at the first capacitor of each stage.

The correction signal line can also, in accordance with another embodiment of the invention, be connected to the first clock signal line, as a result of which the third capacitor of a stage is subjected to the first clock signal which is in opposite phase to the clock signal triggering the first capacitor of this stage. As a result, the threshold voltage and the threshold voltage shift can be compensated up to a value corresponding to double the value of the voltage rise at the first capacitor of a stage.

In accordance with a further embodiment of the circuit in accordance with the invention, the appropriate stage is provided with a fourth MOS transistor for tapping an intermediate voltage along the voltage multiplying circuit, with the source electrode of the fourth MOS transistor being connected to the first summing point and its gate electrode to the second summing point, and the intermediate voltage being tappable at the drain electrode of this fourth MOS transistor.

In a particularly advantageous embodiment of the invention, the MOS transistors are of the p-channel type, while in a further preferred embodiment in accordance with the invention the last stages comprise MOS transistors of the opposing conductivity type.

BRIEF DESCRIPTION OF THE DRAWINGS

The invention is described in greater detail in the following description taken in conjunction with the accompanying drawings, in which.

DESCRIPTION OF THE PREFERRED EMBODIMENTS

Figure 1:
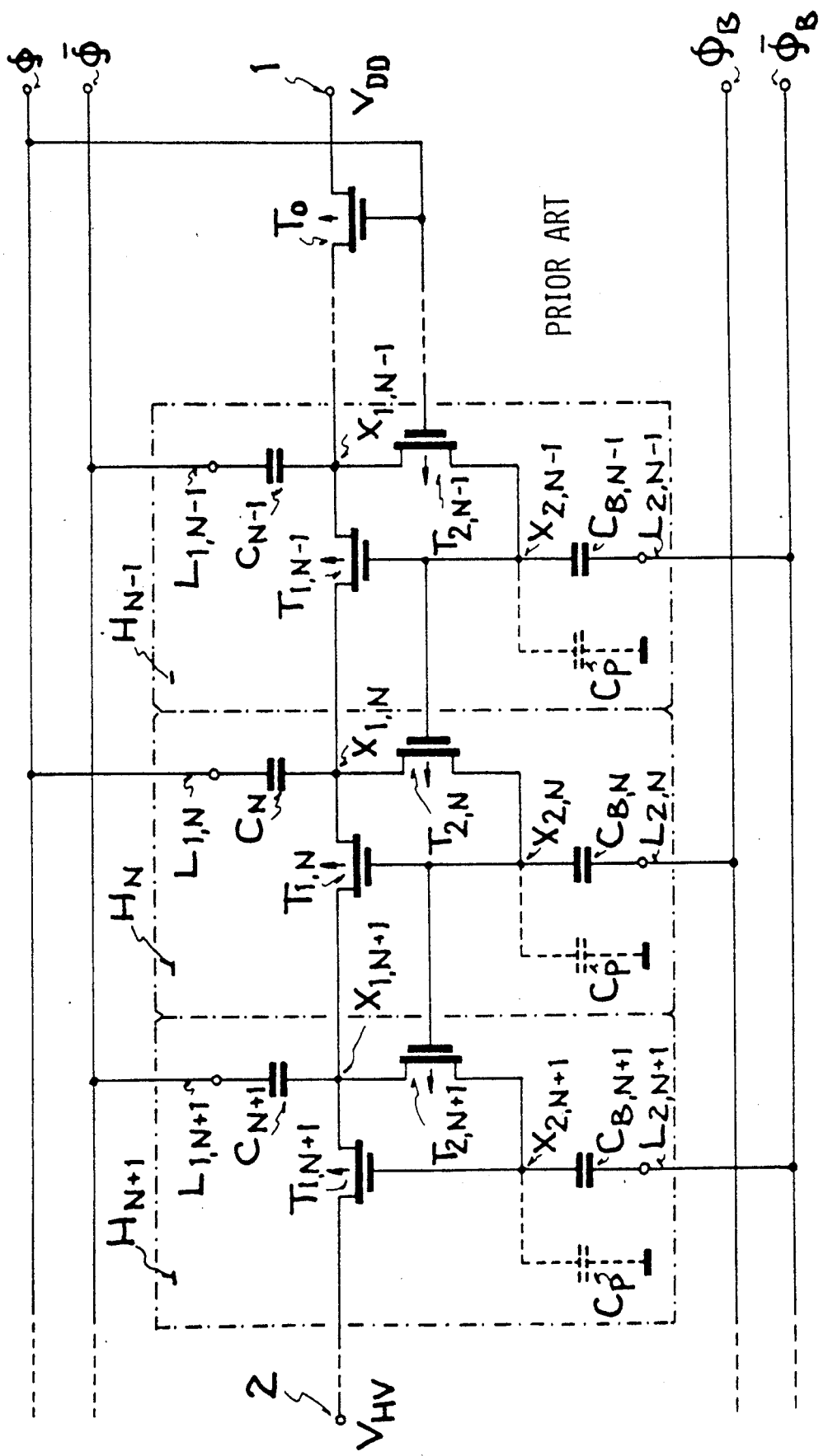
FIG. 1 is a schematic diagram of a voltage multiplying circuit according to the prior art.
Figure 2:
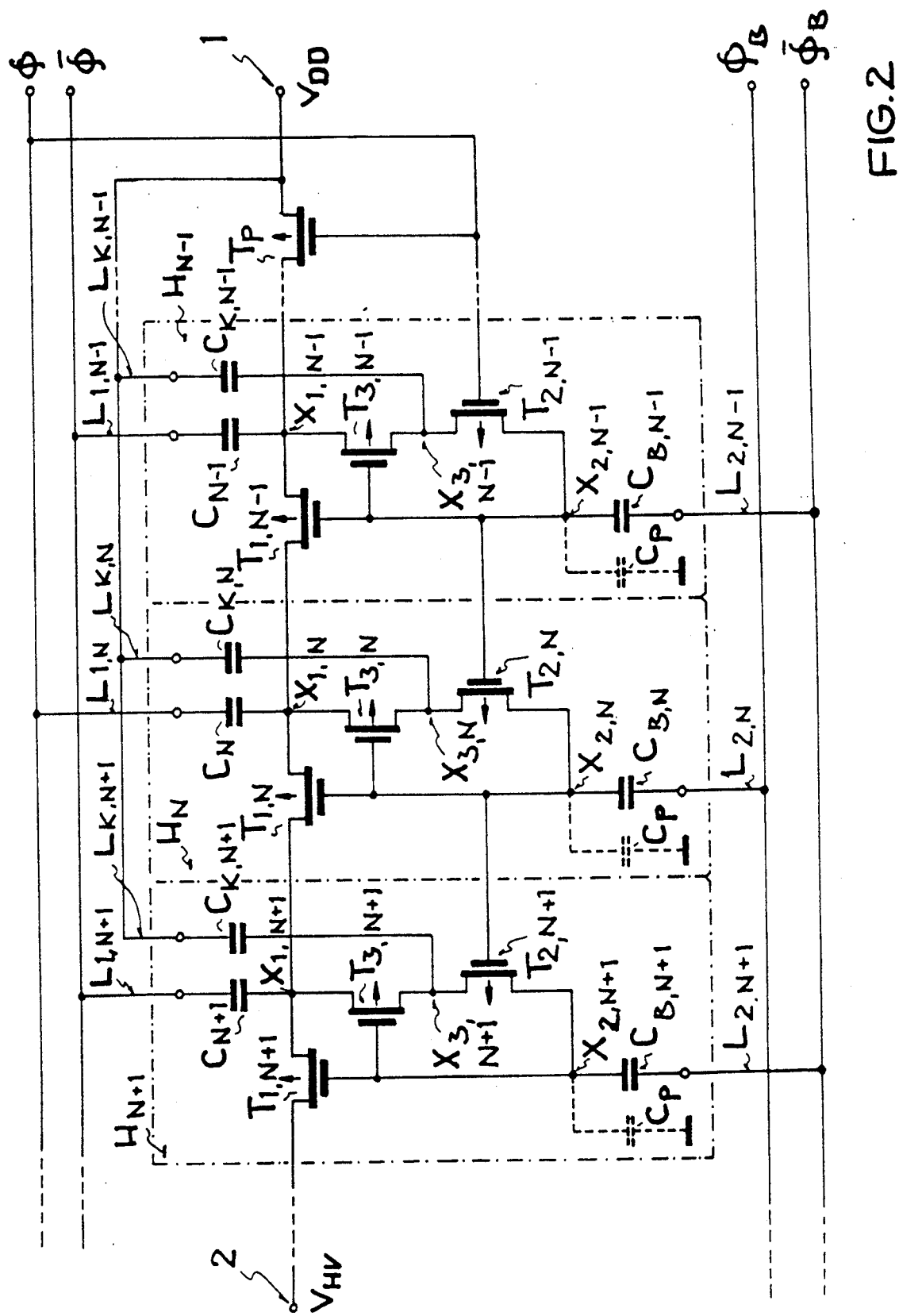
FIG. 2 is a schematic circuit diagram of an embodiment of a voltage multiplying circuit according to the invention.

In the voltage multiplying circuit according to FIG. 2, $H_{N-1}$, $H_N$ and $H_{N+1}$ each designate a stage corresponding to the circuit in FIG. 1. The function of the first and second transistors and of the first and second capacitors of the various stages has already been described in the explanation of the circuit according to FIG. 1.

It was shown there that in order to block the first transistor of a stage, for example the transistor $T_{1,N}$ of stage $H_N$, the gate/source voltage of the first transistor becomes zero. However, since the threshold voltage of these transistors can be up to 4 V because of the substrate effect, it is sufficient, for reliable blocking of this first transistor $T_{1,N}$, to make the gate/source voltage just large enough for it to equal or fall slightly short of the sum of the threshold voltage and the threshold voltage shift. For this purpose, an additional third transistor and an additional third capacitor are provided in each stage $H_{N-1}$, $H_N$ and $H_{N+1}$, i.e. as shown in FIG. 2. That is the transistors $T_{3,N-1}$, $T_{3,N}$ and $T_{3,N+1}$ respectively, and the capacitors $C_{K,N-1}$, $C_{K,N}$ and $C_{K,N+1}$ respectively are added to the respective stage. The circuit according to FIG. 2 therefore corresponds to the known circuit according to FIG. 1 with the exception of these additional elements.

The connection of these additional elements will now be explained using the example of stage $H_N$ of the circuit according to FIG. 2. Here, the source/drain path of the third transistor $T_{3,N}$ connects the first summing point $X_{1,N}$ to the source electrode of the second transistor $T_{2,N}$ of the stage $H_N$, while its gate electrode is connected to the gate electrode of the first transistor $T_{1,N}$ of the same stage. The summing point between the drain electrode of the new third transistor $T_{3,N}$ and the source electrode of the second transistor $T_{2,N}$ of stage $H_N$ is the third summing point and is designated $X_{3,N}$. The third capacitor $C_{K,N}$ is connected by its first connecting electrode to this third summing point $X_{3,N}$ and is connected by its second connecting electrode via a correction signal line $L_{K,N}$ to operating potential $V_{DD}$. The other two stages $H_{N-1}$ and $H_{N+1}$ are designed correspondingly. A voltage multiplying circuit can have even more stages in addition to the three stages shown in the circuit.

The following explains the function of the circuit in accordance with FIG. 2. Here, the high and low levels of the clock signal $\emptyset$ are 0 and $-2$ V respectively, while the high and low levels of the clock signal $\emptyset_B$ are 0 and $-3.5$ V respectively. When transferring the charge from capacitor $C_N$ of stage $H_N$ to capacitor $C_{N+1}$ of stage $H_{N+1}$, both the clock signal $\emptyset$ and the clock signal $\emptyset_B$ are at the low level, while the clock signal $\overline{\emptyset}_B$ is at the high level. The transistor $T_{1,N}$ is conducting during this clock phase, therefore the voltage difference V between the first summing point $X_{1,N}$ and the second summing point $X_{2,N}$ is greater than the sum of the threshold voltage and the threshold voltage shift. Since the transistor $T_{1,N}$ is conducting, the transistor $T_{3,N}$ is also conducting, since the same gate/source voltage is being applied to both. For this reason, the third summing point $X_{3,N}$ is at the potential of the first summing point $X_{1,N}$. The potential assumed in the explanation of the circuit according to FIG. 1 at the first summing points $X_{1,N}$ and $X_{1,N+1}$ of the stages $H_N$ and $H_{N+1}$ would here be approx. $-10$ V. The capacitor $C_{K,N}$ is therefore charged to this potential of approx. $-10$ V. The transistor $T_{2,N}$ is non-conducting at this point. The second summing point $X_{2,N}$ is at a potential of approx. $-12.5$ V.

At the transition to the next clock phase, in which the two clock signals $\emptyset$ and $\emptyset_B$ are at the high level while clock signal $\overline{\emptyset}_B$ is at the low level, the capacitor $C_{K,N}$ discharges in the direction of the first summing point $X_{1,N}$ to a potential whose value is lower than the potential at the first summing point $X_{1,N}$ by the sum of the threshold voltage and the threshold voltage shift. However, this means that at this value the discharge of the capacitor $C_{K,N}$ stops, since then the transistor $T_{3,N}$ and hence the transistor $T_{1,N}$ pass to the non-conducting state. There now follows a charge transfer from the capacitor $C_{N-1}$ of stage $H_{N-1}$ to capacitor $C_N$ of stage $H_N$, with the summing points $X_{1,N-1}$ and $X_{1,N}$ being at a potential of $-8$ V. Since at this time the second transistor $T_{2,N}$ of stage $H_N$ is conducting, the second and third summing points $X_{2,N}$ and $X_{3,N}$ are at the same potential of approx. $-9$ V. The sum of the threshold voltage and the threshold voltage shift is therefore approx. 1 V in this case.

Since the gate/source voltage of transistor $T_{1,N}$ at the transition to the non-conducting state is only reduced by the discharge of capacitor $C_{K,N}$ until this transistor is just non-conducting, process-related fluctuations of the threshold voltage and of the threshold voltage shift are compensated. The additional circuitry requirement per stage is by contrast very low, since it only comprises an additional MOS transistor $T_{3,N}$ with minimum dimensions and an additional capacitor $C_{K,N}$ with a low capacitance of preferably 0.2 pF.

Figure 3:
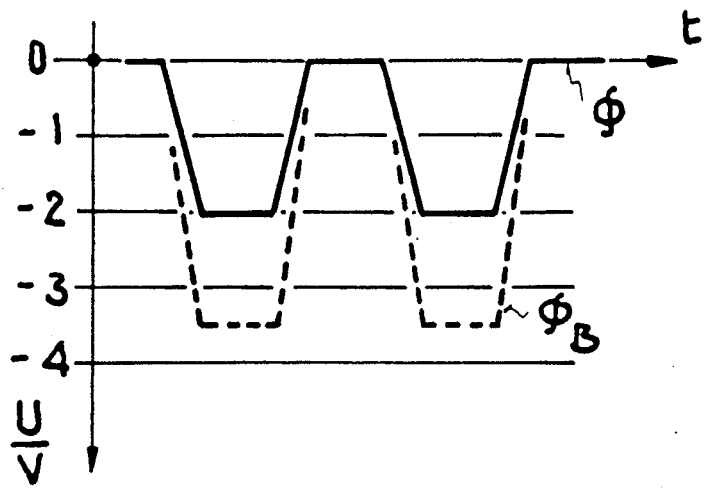
FIG. 3 is a diagram of the clock signals $\emptyset$ and $\emptyset_B$.

Since this value for the capacitor $C_{K,N}$ is very low in comparison with that for the pumping capacitor $C_N$ (preferably 5 pF), there are no detrimental effects to be expected on the functioning of the circuit. In addition, only a low signal rise is necessary for the clock signal $\emptyset_B$ in order to return the transistor $T_{1,N}$ to the conducting state. It is sufficient for the level of the clock signal $\emptyset_B$ to be approx. 1 V more negative than that of the clock signal $\emptyset$. FIG. 3 shows an example for the voltage level of the clock signals $\emptyset$ and $\emptyset_B$ at an operating voltage $V_{DD}$ of $-2$ V, with the low level for the clock signal $\emptyset$ being $-2$ V and for the clock signal $\emptyset_B -3.5$ V. This voltage difference of approx. 1.5 V can be achieved without major circuitry expense using an integrated voltage doubler circuit which also requires no large integrated pumping capacitors.

According to FIG. 2, the additional capacitors $C_{K,N-1}$, $C_{K,N}$ and $C_{K,N+1}$ of stages $H_{N-1}$, $H_N$ and $H_{N+1}$ respectively are connected to correction signal lines $L_{K,N-1}$, $L_{K,N}$ and $L_{K,N+1}$ respectively, which in turn are at the operating potential $V_{DD}$. As a result, the maximum achievable compensation of threshold voltage and threshold voltage shift is identical to the level of the voltage rise at the pumping capacitors $C_{N-1}$, $C_N$ and $C_{N+1}$. If, for example, the value of the sum of the threshold voltage and threshold voltage shift were greater than 2 V, the capacitor $C_{K,N}$ of stage $H_N$, for example, would not discharge, but the third summing point $X_{3,N}$ would remain at a potential of approx. $-10$ V. In this case, therefore, the charge of the additional capacitor $C_{K,N}$ would not be reversed, so that the voltage multiplying circuit is not placed under additional load by this capacitor $C_{K,N}$. If the required threshold voltage compensation is less than the signal rise at the capacitor $C_N$ of stage $H_N$ (for example 1.5 V), the charge of capacitor $C_{K,N}$ is reversed in each clock cycle with the difference voltage, the charge necessary for the purpose being provided from the previous pumping capacitor $C_{N-1}$ of stage $H_{N-1}$. The result hereof is a low voltage loss, which is however negligible provided the capacitance of the capacitor $C_{K,N}$ is substantially lower than that of pumping capacitor $C_N$. This case however only occurs when the circuit has optimum properties, i.e. low threshold voltage and low substrate effect, which in practice scarcely ever occurs as a rule.

If the compensation of the threshold voltage and the threshold voltage shift according to FIG. 2 is insufficient, the capacitor $C_{K,N}$ of stage $H_N$ can also be triggered by a signal in opposite phase to the summing point $X_{1,N}$ instead of by a fixed potential. If, for example, the capacitor $C_N$ of stage $H_N$ is triggered by the clock signal $\emptyset$, the capacitor $C_{K,N}$ must be triggered by the opposite-phase clock signal $\overline{\emptyset}$. In this way, compensation of the sum of the threshold voltage and threshold voltage shift up to twice the level of the voltage rise at the capacitor $C_N$ can be achieved. This type of triggering is advantageous for those stages of a voltage multiplying circuit close to the output voltage where the highest substrate effect occurs.

If the voltage multiplying circuit in accordance with FIG. 2 is made up of transistors of one conductivity type—for example the p-channel type—it is possible to attain in the second transistor of the last stage of the voltage multiplying circuit the breakthrough voltage of the drain-substrate diode, if high output voltages are to be generated. For example, at an output voltage of approx. $-20$ V, the gate electrode of the first transistor of a final stage of a voltage multiplying circuit has to be shifted approx. 3.5 V to 4 V more negative in order to avoid a voltage loss. It is however possible here to already exceed the breakthrough voltage mentioned.

To avoid a breakthrough of this type, the transistors of the last two or three stages of a voltage multiplying circuit in accordance with FIG. 2 can be made up of transistors of the opposite conductivity type, i.e. of the n-channel type, if the previous stages contain transistors of the p-channel type. A voltage multiplying stage of this type is shown in FIG. 5, where the first stage $H_{N-1}$ has p-channel transistors and the two last stages $H_N$ and $H_{N+1}$ have n-channel transistors.

However, these two last stages $H_N$ and $H_{N+1}$ differ in their design here from the first stage $H_{N-1}$. These stages each contain only two MOS transistors $T_{1,N}$ and $T_{2,N}$, and $T_{1,N+1}$ and $T_{2,N+1}$ respectively of the n-channel type, and a first and a second capacitor $C_N$ and $C_{B,N}$ and $C_{N+1}$ and $C_{B,N+1}$ respectively. These components are fitted in the same way as the first stage $H_{N-1}$, but with the source and drain electrodes of the first transistors $T_{1,N}$ and $T_{1,N+1}$ of the two last stages $H_N$ and $H_{N+1}$ being reversed, so that the drain electrodes of the first transistor $T_{1,N}$ and $T_{1,N+1}$ form the first summing points $X_{1,N}$ and $X_{1,N+1}$ respectively, and the source electrode of the first transistor $T_{1,N}$ of stage $H_N$ is connected to the drain electrode of the first transistor $T_{1,N+1}$ $T_{1,N+1}$ of stage $H_{N+1}$, with the source electrode of said transistor forming the output of the stage $H_{N+1}$. The first stage $H_{N-1}$ is connected to the second stage $H_N$ by connection of the drain electrode of the first transistor $T_{1,N-1}$ of the first stage $H_{N-1}$ to the drain electrode of the first transistor $T_{1,N}$ of the second stage $H_N$. The gate electrodes of the second transistors $T_{2,N}$ and $T_{2,N+1}$ of the second and third stages $H_N$ and $H_{N+1}$ respectively are connected to the first summing points $X_{1,N}$ and $X_{1,N+1}$ respectively of these stages $H_N$ and $H_{N+1}$, while their drain electrodes are connected to the second summing points $X_{2,N}$ and $X_{2,N+1}$ respectively and their source electrodes to the source electrodes of the first transistors $T_{1,N}$ and $T_{1,N+1}$ respectively.

Figure 5:
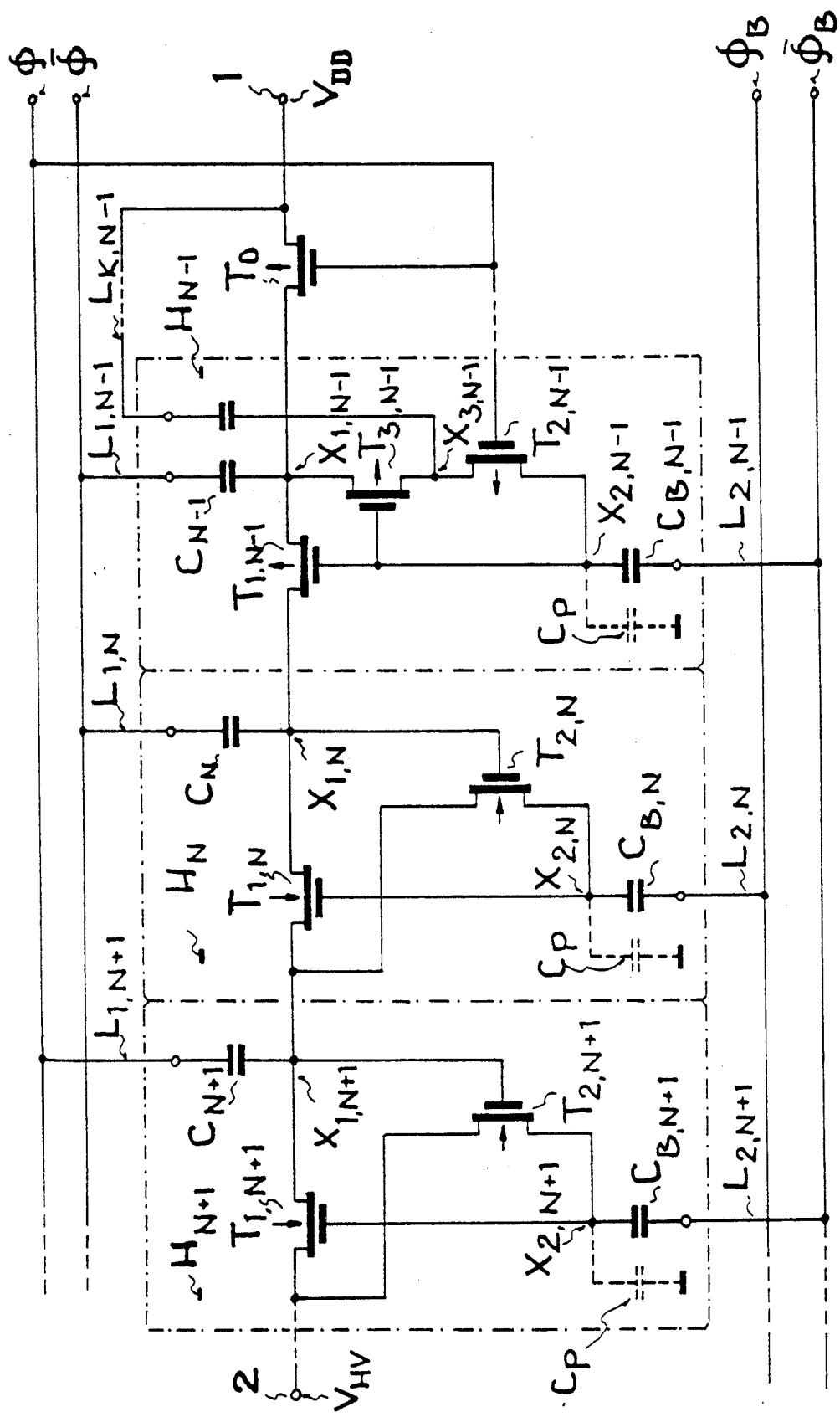
FIG. 5 is a schematic circuit diagram of a further embodiment of a voltage multiplying circuit in accordance with the invention.

The function of this circuit in accordance with FIG. 5 is explained in the following. It can be assumed here that the clock signals $\emptyset$ and $\emptyset_B$ are set at the low level ($-2$ V and $-3.5$ V respectively) and the clock signals $\overline{\emptyset}$ and $\overline{\emptyset}_B$ are at the high level (0 V), and that a charge is transferred from the pumping capacitor $C_{N-1}$ of the first stage $H_{N-1}$ to the pumping capacitor of the second stage $H_N$, so that the first transistor $T_{1,N-1}$ of the first stage $H_{N-1}$ is conducting. The first summing points $X_{1,N-1}$ and $X_{1,N}$ of the first and second stages $H_{N-1}$ and $H_N$ are therefore of necessity at the same potential, for example $-16$ V. The potential of the first summing point $X_{1,N+1}$ of the last stage $H_{N+1}$ is accordingly at a potential of $-20$ V. The result of this is that the second transistor $T_{2,N}$ of the second stage $H_N$ is conducting, for which reason the gate/source voltage of the first transistor $T_{1,N}$ of the second stage $H_N$ is 0 V and the transistor is therefore non-conducting.

In the transition to the next clock phase, the clock signals $\emptyset$ and $\emptyset_B$ change over to the high level and the clock signals $\overline{\emptyset}$ and $\overline{\emptyset}_B$ to the low level, as a result of which both the first summing point of the second stage $H_N$ and that of the last stage $H_{N+1}$ are shifted to a potential of $-18$ V, for which reason the second transistor $T_{2,N}$ of the second stage $H_N$ passes to the non-conducting state and at the same time the second summing point $X_{2,N}$ of the second stage $H_N$ because of the clock change rises to a potential of $-16.5$ V. Accordingly, the first transistor $T_{1,N}$ of the second stage $H_N$ has a gate/source voltage of 1.5 V which sets it to the conducting state. A charge is now transferred from the pumping capacitor $C_N$ to the pumping capacitor $C_{N+1}$, with the first transistor $T_{1,N+1}$ of the last stage $H_{N+1}$ being non-conducting, since the second transistor $T_{2,N+1}$ of this stage $H_{N+1}$ is conducting and therefore generates a gate/source voltage of 0 V for this first transistor $T_{1,N+1}$.

After a further clock phase, the clock signals $\emptyset$ and $\emptyset_B$ revert to the low level and the clock signals $\overline{\emptyset}$ and $\overline{\emptyset}_B$ to the high level. As a result, the first summing point $X_{1,N}$ of the second stage $H_N$ shifts to a potential of $-16$ V and that of the last stage $H_{N+1}$ to $-20$ V; this generates for the second transistor $T_{2,N}$ of the second stage $H_N$ a gate/source voltage of 4 V, so that it switches to the conducting state. This has the effect that the potential of $-20$ V at the source electrode of the first transistor $T_{1,N}$ is transferred to the second summing point $X_{2,N}$ of the second stage $H_N$, as a result of which this first transistor has a gate/source voltage of 0 V and therefore passes to the non-conducting state, while the potential of $-20$ V of the first summing point $X_{1,N+1}$ is transferred via the conducting first transistor $T_{1,N+1}$ of the same stage to the output $V_{HV}$ or to a next stage.

Figure 4:
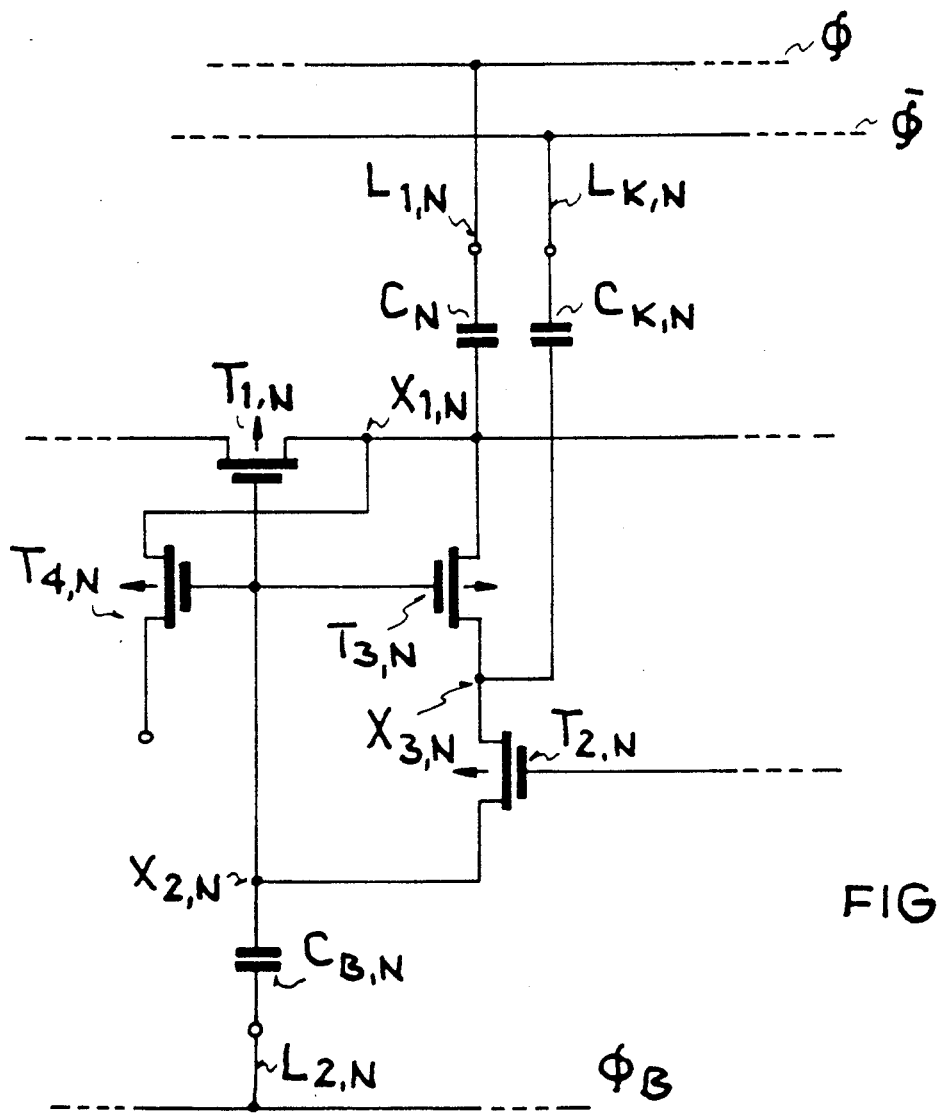
FIG. 4 is a schematic diagram of an embodiment of a circuit for tapping an intermediate voltage according to the invention.

If voltages lower than the output voltage $V_{HV}$ are to be tapped along the voltage multiplying circuit, this can be achieved in accordance with FIG. 4. Here, only the Nth stage of the voltage multiplying circuit in accordance with FIG. 2 is shown at which an intermediate voltage is to be tapped. This is achieved using a fourth transistor $T_{4,N}$ whose source electrode is connected to the first summing point $X_{1,N}$ and whose gate electrode is connected to the gate electrode of the first transistor $T_{1,N}$. The intermediate voltage can be tapped at the drain electrode of this fourth transistor $T_{4,N}$. This fourth transistor $T_{4,N}$ is conducting only when the first transistor $T_{1,N}$ is conducting.

The previously described embodiments of a voltage multiplying circuit in accordance with the invention can be advantageously used in a chip with EEPROM cells, for example.

What is claimed is:

1. A voltage multiplying circuit having a number of stages; each stage comprising a first and a second MOS transistor and a first and a second capacitor, with a first summing point connected directly to the source electrode of said first MOS transistor being connected via said first capacitor to a first clock line supplying a first clock signal, with a second summing point which connects the gate electrode of said first MOS transistor directly to the drain electrode of said second MOS transistor being connected via said second capacitor to a second clock line supplying a second clock signal, and with adjacent stages being connected via the first summing point of one adjacent stage to the drain electrode of said first MOS transistor of the other adjacent stage, wherein the gate electrode of said second MOS transistor of the one adjacent stage is connected to the gate electrode of said first MOS transistor of the other adjacent stage, each stage for blocking said first MOS transistor having means which sets its gate/source voltage in such a way that it is equal to or just below the sum of the threshold voltage and the threshold voltage shift.

2. A voltage multiplying circuit according to claim 1, wherein the means comprise a third MOS transistor and a third capacitor, the source electrode of said third MOS transistor being connected to the first summing point, its gate electrode to the second summing point, and its drain electrode via a third summing point to the source electrode of the second MOS transistor and said third summing point being connected via said third capacitor to a correction signal line.

3. A voltage multiplying circuit according to claim 2, wherein the correction signal line is subjected to a constant operating voltage potential.

4. A voltage multiplying circuit according to claim 2, wherein the correction signal line is connected to the first clock signal line and is subjected to the first clock signal which is in opposite phase to the clock signal triggering the first capacitor.

5. A voltage multiplying circuit according to claim 2, wherein the appropriate stage has a fourth MOS transistor for tapping an intermediate voltage along the voltage multiplying circuit, the source electrode of said fourth MOS transistor being connected to the first summing point and its gate electrode to the second summing point, and the intermediate voltage being tappable at the drain electrode of said fourth MOS transistor.

6. A voltage multiplying circuit according to claim 1, wherein the MOS transistors are of the p-channel type.

7. A voltage multiplying circuit according to claim 1, wherein the MOS transistors are of the same one channel conductivity type.

8. A voltage multiplying circuit having a number of sequential stages, each stage comprising a first and a second MOS transistor and a first and a second capacitor with a first summing point connected directly to the drain electrode of said first MOS transistor being connected via said first capacitor to a first clock line supplying a first clock signal, with a second summing point which connects the gate electrode of said first MOS transistor directly to the drain electrode of said second MOS transistor being connected via said second capacitor to a second clock line supplying a second clock signal, and with adjacent stages being connected via the first summing point of one adjacent stage to the source electrode of said first MOS transistor of the other adjacent stage, wherein the gate electrode of said second MOS transistor of said other adjacent stage is connected to said first summing point of said other adjacent stage.

9. A voltage multiplying circuit according to claim 8, wherein the MOS transistors are of the n-channel type.

10. A voltage multiplying circuit according to claim 8, wherein the MOS transistors are of the same channel conductivity type.

11. A voltage multiplying circuit according to claim 9, wherein said sequential stages are the last stages in a string of stages of a greater number and said circuit further comprises at least one first stage proceeding said sequential stages in said string of stages, the at least one first stage being provided with first and second MOS transistors of the p-channel type, each first stage further comprising a first and a second capacitor, with a first summing point connected directly to the source electrode of said first MOS transistor being connected via said first capacitor to said first clock line, with a second summing point which connects the gate electrode of said first MOS transistor directly to the drain electrode of said second MOS transistor being connected via said second capacitor to said second clock line, and with adjacent first and last stages being connected via the first summing point of the adjacent last stage to the drain electrode of said first MOS transistor of the adjacent first stage, said at least one first stage for blocking its first MOS transistor having means for setting the gate/source voltage of its respective first MOS transistor so that it is equal to just below the sum of the threshold voltage and the threshold voltage shift.

12. A voltage multiplying circuit including a string of stages comprising:
a first stage comprising a first and a second MOS transistor of the same conductivity channel type and a first and a second capacitor, with a first summing point connected directly to the source electrode of said first MOS transistor being connected via said first capacitor to a first clock line supplying a first clock signal, with a second summing point which connects the gate electrode of said first MOS transistor directly to the drain electrode of said second MOS transistor being connected via said second capacitor to a second clock line supplying a second clock signal; said first stage further comprising means for setting the gate/source voltage of said first MOS transistor so that its gate/source voltage is equal to just below the sum of the threshold voltage and the threshold voltage shift; and
a number of sequential last stages following said first stage in said string of stages, each said last stage comprising a first and a second MOS transistor of the channel conductivity type opposite to that of the MOS transistors of said first stage and a first and a second capacitor, with a first summing point connected directly to the drain electrode of said first MOS transistor being connected via said first capacitor to a first clock line supplying a first clock signal, with a second summing point which connects the gate electrode of said first MOS transistor directly to the drain electrode of said second MOS transistor being connected via said second capacitor to a second clock line supplying a second clock signal, and with adjacent stages being connected via the first summing point of one adjacent stage to the source electrode of said first MOS transistor of the other adjacent stage, wherein the gate electrode of said second MOS transistor of said other adjacent stage is connected to said first summing point of said other adjacent stage.

* * * * *